United States Patent
Lo et al.

(10) Patent No.: US 6,262,610 B1
(45) Date of Patent: Jul. 17, 2001

(54) VOLTAGE SAMPLE AND HOLD CIRCUIT FOR LOW LEAKAGE CHARGE PUMP

(75) Inventors: Steve Lo; Christian Olgaard; Wai Lau, all of Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/383,162

(22) Filed: Aug. 25, 1999

(51) Int. Cl.[7] ................................................. G11C 27/02
(52) U.S. Cl. ............................. 327/157; 327/148; 327/94; 327/95
(58) Field of Search ................................. 327/91, 94, 95, 327/96, 148, 157

(56) References Cited

U.S. PATENT DOCUMENTS

| | | | |
|---|---|---|---|
| 3,158,759 | * 11/1964 | Jasper | 327/77 |
| 3,304,507 | * 2/1967 | Weekes et al. | 327/95 |
| 4,063,182 | * 12/1977 | Besson | 327/95 |
| 4,302,689 | * 11/1981 | Brodie | 327/95 |
| 4,352,070 | * 9/1982 | Beauducel et al. | 327/95 |
| 4,544,854 | 10/1985 | Ulmer et al. | 327/388 |
| 4,764,689 | * 8/1988 | Thommen | 327/95 |

\* cited by examiner

*Primary Examiner*—Tuan T. Lam
(74) *Attorney, Agent, or Firm*—Baker & McKenzie

(57) ABSTRACT

A voltage sample and hold circuit for use as part of a low leakage charge pump circuit in a phase lock loop (PLL). During an inactive state of the charge pumping function, a MOSFET switch that normally connects the charge pump output to the loop filter preceding the voltage controlled oscillator (VCO) of the PLL is opened, e.g., for open loop modulation of the VCO. Meanwhile, the sample and hold circuit which has sampled the voltage at the input side of the MOSFET switch now maintains that voltage, thereby forcing a zero-voltage difference across the MOSFET switch. This zero-voltage difference virtually eliminates subthreshold leakage current through the MOSFET switch, thereby significantly reducing loss of charge in the loop filter due to such leakage current. This ensures a significantly more constant DC bias at the input to the VCO and, therefore, a more stable output center, or carrier, frequency from the PLL during open loop modulation.

20 Claims, 4 Drawing Sheets

VOLTAGE SAMPLE AND HOLD CIRCUIT FOR LOW LEAKAGE CHARGE PUMP

BACKGROUND OF THE INVENTION

1. Field of the Invention

The present invention relates to sample and hold circuits, and in particular, to voltage sample and hold circuits for low leakage charge pump circuits in phase lock loop applications.

2. Description of the Related Art

Referring to FIG. 1, charge pump circuits are often used in phase lock loop (PLL) applications for driving the voltage controlled oscillator (VCO) with a voltage filtered by a low pass loop filter Zf. Pump-up PU and pump-down PD signals, which are active low and high, drive a P-type metal oxide semiconductor field effect transistor (P-MOSFET) P1 and an N-MOSFET, respectively. These signals PU, PD are active during the active state of a control signal $\phi 1$. During the inactive state of this control signal $\phi 1$, the charge pump drive signals PU, PD are disabled by opening switches S1U and S1D, and the charge pump transistors P1, N1 are turned off by closing switches S2U and S2D. This places the output of the charge pump circuit, i.e., at the mutually connected drain terminals of the output transistors P1, N1, in a high impedance state. This disablement of the charge pump circuit is often done as a way to open the loop of the PLL to allow direct modulation of the VCO with some form of modulation signal MOD.

A problem with this, however, is the effect of leakage currents through the transistors P1, N1 upon the voltage provided to the tuning input of the VCO. This voltage will gradually drift due to the charging or discharging of this node by way of the net leakage current Ioff which is the difference between the leakage current Ileakn of transistor N1 and the leakage current Ileakp of transistor P1 (Ioff= Ileakn−Ileakp). This is due to the typical mismatch between leakage currents for N-MOSFETs and P-MOSFETs and becomes worse as one transistor allows more leakage current than the other.

Typically, the dominant component of these leakage currents is the subthreshold currents of the transistors P1, N1. As MOSFETs are scaled down to smaller device geometries, subthreshold current becomes more substantial as compared to the normal "on" current.

One conventional technique for seeking to isolate the tuning input of the VCO is to introduce an in-line switch S3 which is closed during application of the pump-up PU and pump-down PD signals and opened during the off, or high impedance, state of the charge pump circuit. However, one significant problem with this technique is that switch S3, when it is turned off, does not prevent the output node of the charge pump from drifting due to the net leakage current, Ioff. This results in a voltage difference across switch S3, which will cause the frequency of the output of the VCO to drift.

Referring to FIG. 2, one conventional technique for seeking to prevent unequal voltages from appearing across switch S3 is to use a feedback amplifier A1 in the form of a voltage follower for equalizing the voltages at the tuning input of the VCO and the output node of the charge pump circuit. When switch S3 is opened, switches S4A and S4B are closed, thereby closing this feedback loop and equalizing the voltages on both sides of switch S3. (This is a technique taught by U.S. Pat. No. 4,544,854, issued Oct. 1, 1985, and entitled "Analog Switch Structure Having Low Leakage Current," the disclosure of which is incorporated herein by reference.) However, this technique is not without its own problems. During the period that the voltages on either side of switch S3 are being equalized by the feedback action of amplifier A1, the noise present at the input of the amplifier A1 is now introduced to the tuning input of the VCO, thereby introducing yet another form of noise into the VCO output.

Accordingly, it would be desirable to have a technique for maintaining the voltage at the output node of a charge pump circuit, notwithstanding leakage currents affecting such node, without introducing additional noise.

SUMMARY OF THE INVENTION

A voltage sample and hold circuit in accordance with the present invention compensates for leakage currents affecting the sample node without introducing additional noise to such node. In a preferred embodiment, the voltage at the sample node is sampled immediately following the point in time at which such node is placed into a high impedance state. This voltage is stored across a capacitive circuit element and is buffered by a buffer amplifier and then fed back to such node during the holding period.

In accordance with one embodiment of the present invention, a voltage sample and hold circuit includes a circuit node, a buffer circuit, a charge storage circuit and a switching circuit. The circuit node is configured to convey a node voltage and a hold voltage. The buffer circuit is configured to receive and buffer a sample voltage and in accordance therewith provide the hold voltage which is substantially equal to the sample voltage. The charge storage circuit, coupled to the buffer circuit, is configured to receive and store charge in accordance with the sample voltage and in accordance therewith maintain the hold voltage. The switching circuit, coupled between the circuit node and the buffer circuit, is configured to receive at least one switch control signal and in accordance therewith sample the node voltage, provide the sample voltage and convey the hold voltage.

In accordance with another embodiment of the present invention, a low leakage charge pump circuit includes a circuit node, a current source circuit, a current sink circuit, a buffer circuit, a charge storage circuit and a switching circuit. The circuit node is configured to convey a source current, a sink current, a node voltage and a hold voltage. The current source circuit, coupled to the circuit node, is configured to receive at least one source control signal and in accordance therewith provide the source current during a source time period. The current sink circuit, coupled to the circuit node, is configured to receive at least one sink control signal and in accordance therewith receive the sink current during a sink time period. The buffer circuit is configured to receive and buffer a sample voltage and in accordance therewith provide the hold voltage which is substantially equal to the sample voltage. The charge storage circuit, coupled to the buffer circuit, is configured to receive and store charge in accordance with the sample voltage and in accordance therewith maintain the hold voltage. The switching circuit, coupled between the circuit node and the buffer circuit, is configured to receive at least one switch control signal and in accordance therewith sample the node voltage, provide the sample voltage and convey the hold voltage.

These and other features and advantages of the present invention will be understood upon consideration of the following detailed description of the invention and the accompanying drawings.

DETAILED DESCRIPTION OF THE INVENTION

Figure 3:
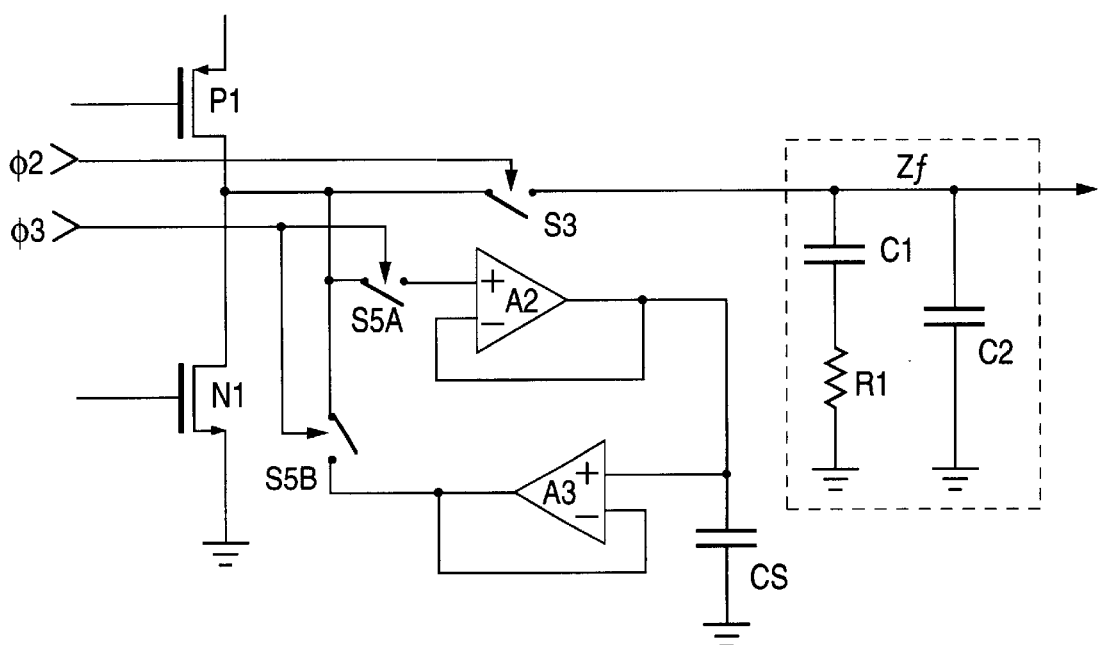
FIG. 3 is a circuit schematic diagram of a portion of a PLL circuit using a voltage sample and hold circuit in accordance with one embodiment of the present invention.

Referring to FIG. 3, a voltage sample and hold circuit in accordance with one embodiment of the present invention is used to compensate for leakage currents in the charge pump circuit of a PLL when connected as shown. The output node of the charge pump, i.e., at the mutually connected drain terminals of transistors P1 and N1 and "pole" of switch S3, is sampled and held using the switched circuit which includes amplifiers A2 and A3, sampling capacitor CS and switches S5A and S5B. (As should be readily understood, the "switches" discussed herein, particularly within an integrated circuit environment using MOSFETs, are typically implemented using pass transistors connected either individually or as complementary pairs in the form of transmission gates and have interchangeable "pole" and "throw" terminals.) Amplifiers A2 and A3 are operational amplifiers connected as voltage follower circuits. During the open (turned-off) state of switch S3, as determined by its control signal $\phi 2$, switches S5A and S5B are closed (turned-on) in accordance with their control signal $\phi 3$. (Control signals $\phi 2$ and $\phi 3$ are active during mutually exclusive time intervals.) Accordingly, the output voltage of the charge pump circuit is sampled via switch S5A and amplifier A2, stored on sampling capacitor CS and held via amplifier A3 and switch S5B. (For purposes of the present discussion, it is assumed that each respective switch is closed during the active, or asserted, state and open during the inactive, or unasserted, state of its respective control signal.)

Figure 4:
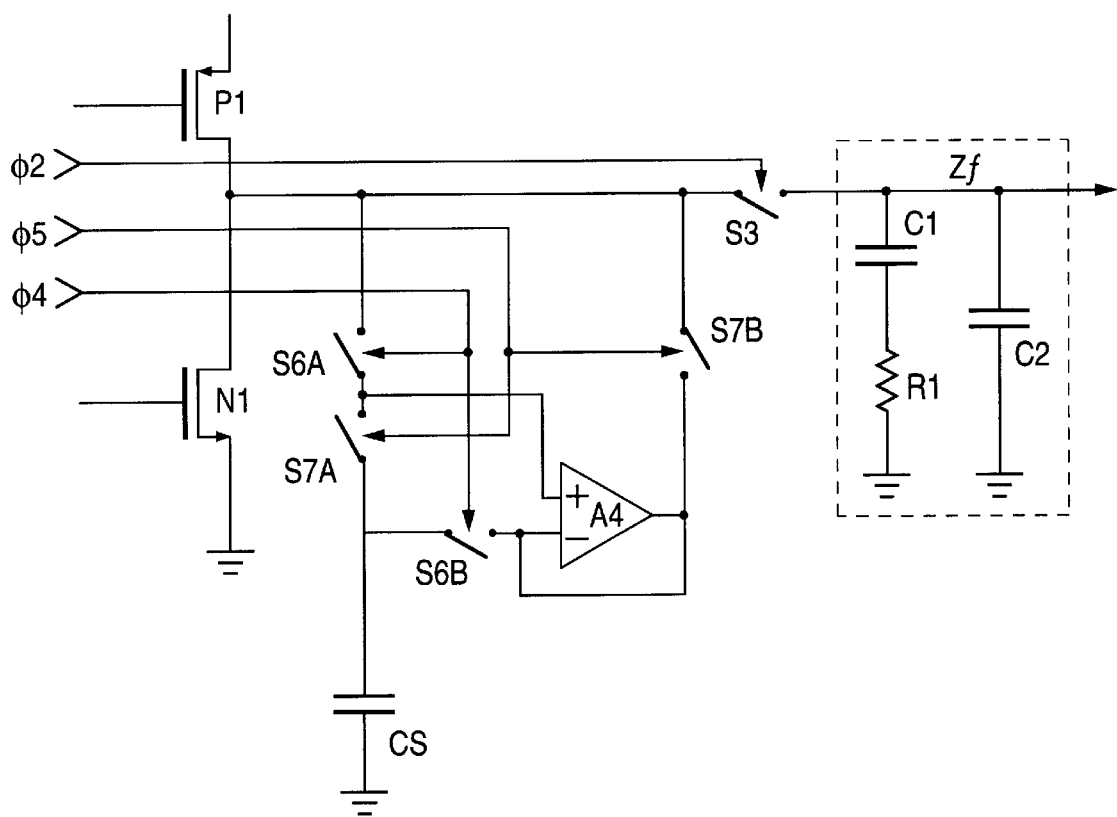
FIG. 4 is a circuit schematic diagram of a portion of a PLL circuit using a voltage sample and hold circuit in accordance with another embodiment of the present invention.

Referring to FIG. 4, a voltage sample and hold circuit in accordance with another embodiment of the present invention requires one less amplifier but one additional switch. (As with the circuit of FIG. 3, the switch control signals $\phi 2$, $\phi 4$, $\phi 5$ are active during mutually exclusive time intervals.) During the open state of switch S3, switches S6A and S6B are closed in accordance with their control signal $\phi 4$. This causes the output voltage of the charge pump circuit to be sampled and stored across the sampling capacitor CS. Once a sufficient time interval has elapsed for charging the capacitor CS, switches S6A and S6B are opened in accordance with their control signal $\phi 4$ and switches S7A and S7B are closed in accordance with their control signal $\phi 5$. This causes the sampled voltage held by capacitor CS to be buffered by amplifier A4 and applied to the output node of the charge pump circuit and "pole" of switch S3.

Figure 5:
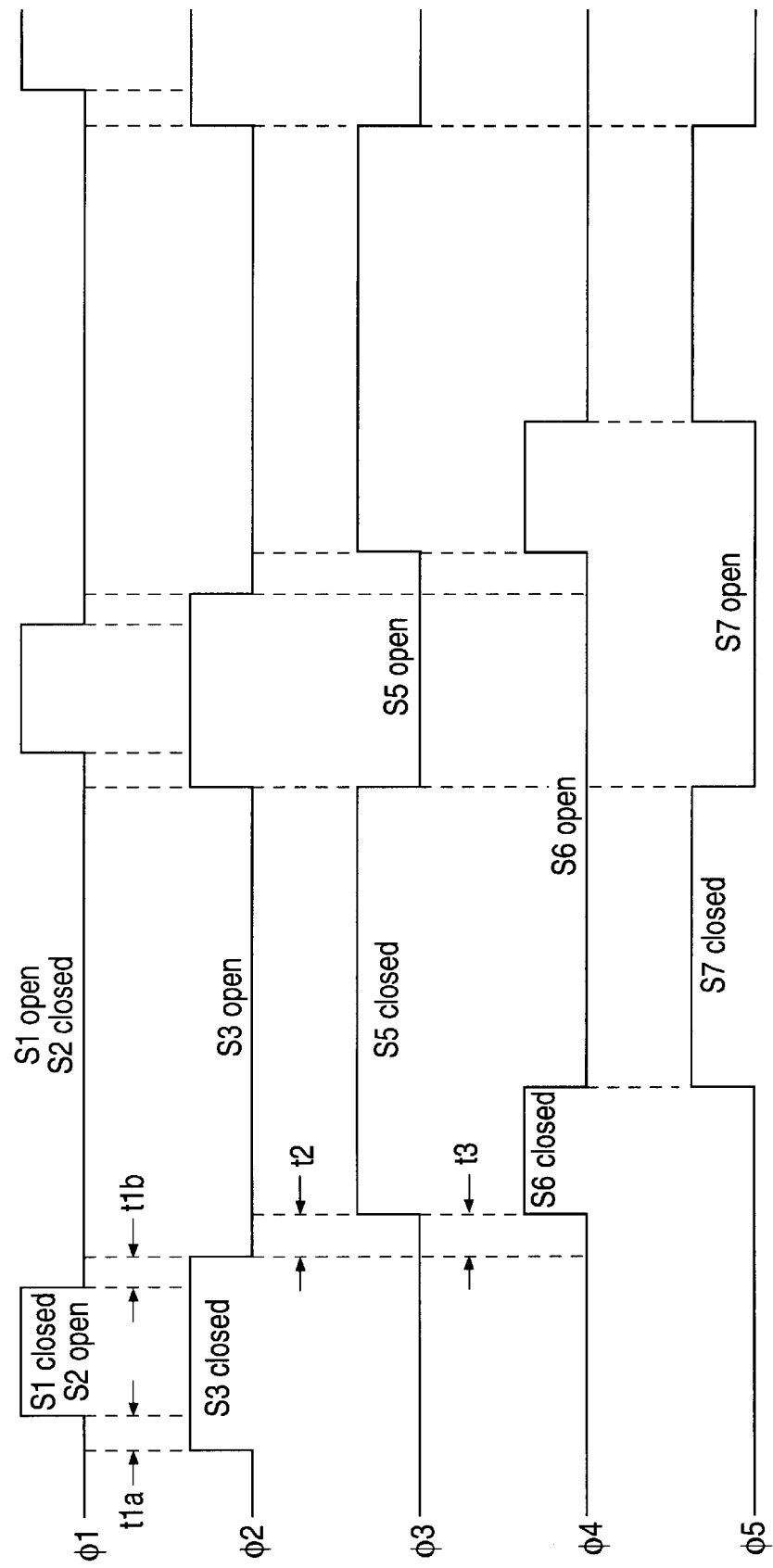
FIG. 5 is a signal timing diagram for the clock signals associated with the circuits of FIGS. 3 and 4.

Referring to FIG. 5, the relative timing relationships of the various control signals associated with the circuits of FIGS. 3 and 4 can be better understood. For example, as discussed above in connection with the circuit of FIG. 3, control signals $\phi 2$ and $\phi 3$ have mutually exclusive active states. Similarly, as discussed above in connection with the circuit of FIG. 4, control signals $\phi 2$, $\phi 4$ and $\phi 5$ have mutually exclusive active states. (It should be noted, that the relative signal overlap or spacing intervals t1a, t1b, t2, t3 are not necessarily drawn to scale and can be as long or as short as necessary depending upon the specific application or use of the respective circuits.)

Figure 1:
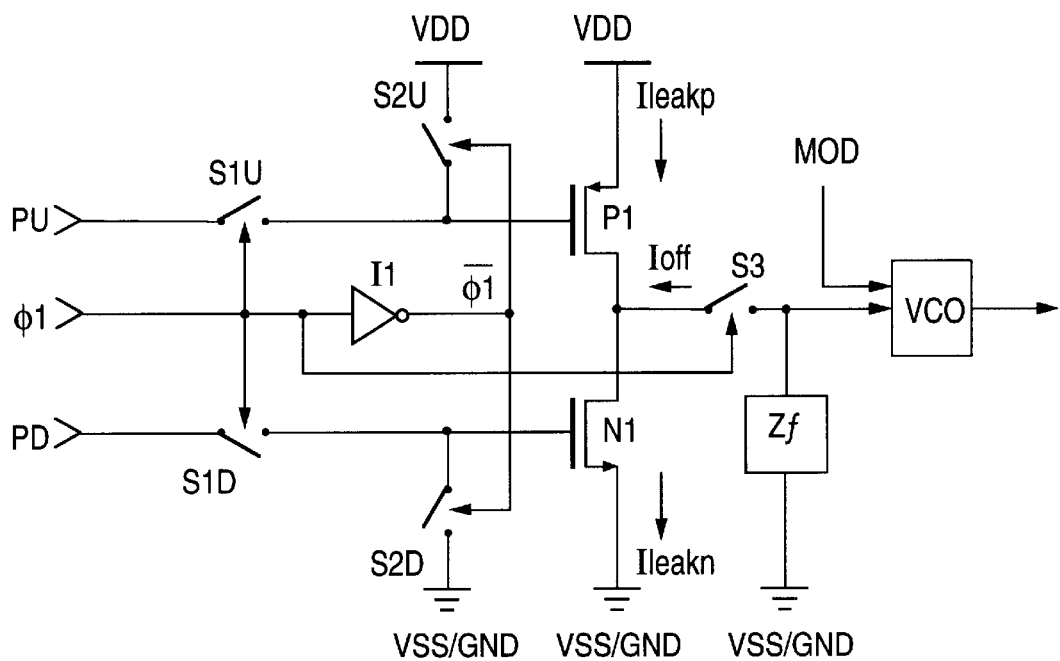
FIG. 1 is a schematic and functional block diagram of a portion of a conventional PLL circuit.
Figure 6A:
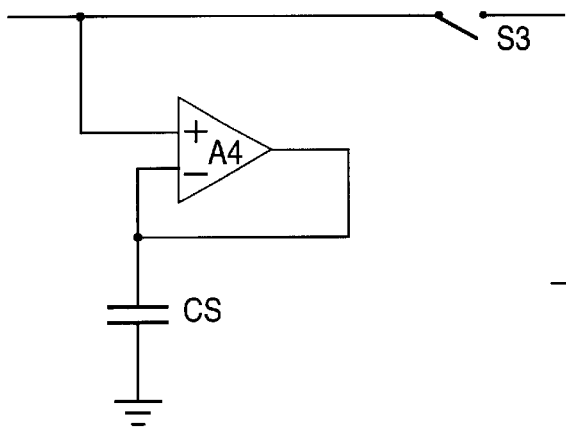
FIGS. 6A and 6B are partial circuit schematic diagrams for the two operational states of the voltage sample and hold circuit of FIG. 4.
Figure 6B:
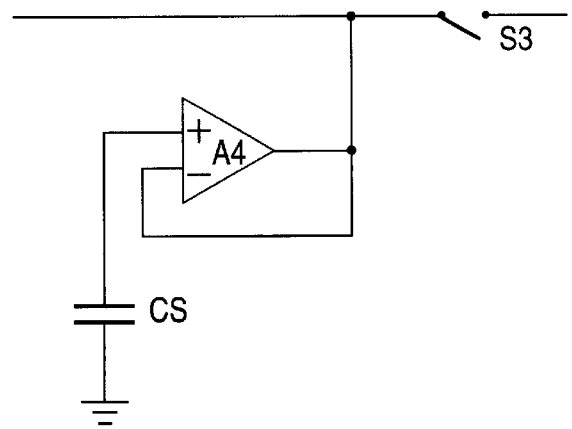
Figure 2:
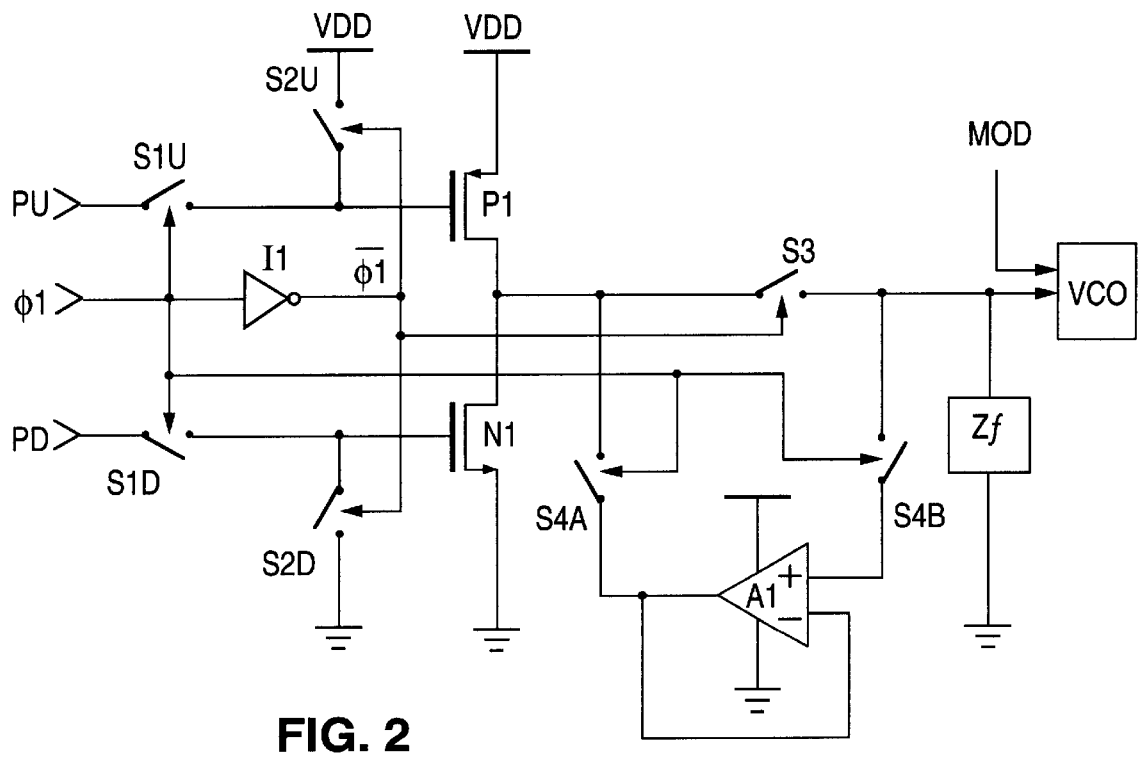
FIG. 2 is a circuit schematic and functional block diagram of a portion of a conventional PLL circuit providing compensation for charge pump leakage currents.

Referring to FIGS. 6A and 6B, the sample and hold operational states, respectively, of the circuit of FIG. 4 can be better visualized. As discussed above, during the sample interval, when switch S3 is open, switches S6A and S6B are closed and switches S7A and S7B are open. Conversely, during the hold interval, when switch S3 is still open, switches S6A and S6B are open and switches S7A and S7B are closed.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a voltage sample and hold circuit, comprising:
   a circuit node that alternately conveys a node voltage and a hold voltage;
   a buffer circuit that receives and buffers a sample of said node voltage and provides said hold voltage which is substantially equal to said node voltage sample;
   a charge storage circuit, coupled to said buffer circuit, that receives and stores charge corresponding to said node voltage sample and maintains said hold voltage; and
   a switching circuit, coupled between said circuit node and said buffer circuit, that receives at least one switch control signal and alternately samples said node voltage, provides said node voltage sample and conveys said hold voltage.

2. The apparatus of claim 1, wherein said charge storage circuit:
   receives and stores charge corresponding to said node voltage sample during a sample time period; and
   maintains said hold voltage during a hold time period which is nonconcurrent with said sample time period.

3. The apparatus of claim 1, wherein said charge storage circuit receives and stores charge corresponding to said node voltage sample and maintains said hold voltage concurrently.

4. The apparatus of claim 1, wherein said buffer circuit comprises a voltage follower circuit.

5. The apparatus of claim 1, wherein:
   said buffer circuit comprises first and second voltage follower circuits which are mutually coupled; and
   said charge storage circuit is coupled between said first and second voltage follower circuits.

6. The apparatus of claim 1, wherein said charge storage circuit comprises a capacitor.

7. The apparatus of claim 1, wherein said switching circuit comprises a plurality of pass transistors.

8. An apparatus including a voltage sample and hold circuit, comprising:

node means for alternately conveying a node voltage and a hold voltage;

buffer means for receiving and buffering a sample of said node voltage and providing said hold voltage which is substantially equal to said node voltage sample;

charge storage means, coupled to said buffer means, for receiving and storing charge corresponding to said node voltage sample and maintaining said hold voltage; and switching means, coupled between said node means and said buffer means, for receiving at least one switch control signal and alternately sampling said node voltage, providing said node voltage sample conveying said hold voltage.

9. The apparatus of claim 8, wherein said charge storage means is for:

receiving and storing charge corresponding to said node voltage sample during a sample time period; and maintaining said hold voltage during a hold time period which is nonconcurrent with said sample time period.

10. The apparatus of claim 8, wherein said charge storage means is for receiving and storing charge corresponding to said node voltage sample and maintaining said hold voltage concurrently.

11. An apparatus including a low leakage charge pump circuit, comprising:

a circuit node that alternately conveys a source current, a sink current, a node voltage and a hold voltage;

a current source circuit, coupled to said circuit node, that receives at least one source control signal and provides said source current during a source time period;

a current sink circuit, coupled to said circuit node, that receives at least one sink control signal and receives said sink current during a sink time period;

a buffer circuit that receives and buffers a sample of said node voltage and provides said hold voltage which is substantially equal to said node voltage sample;

a charge storage circuit, coupled to said buffer circuit, that receives and stores charge corresponding to said node voltage sample and maintains said hold voltage; and a switching circuit, coupled between said circuit node and said buffer circuit, that receives at least one switch control signal and alternately samples said node voltage, provides said node voltage sample and conveys said hold voltage.

12. The apparatus of claim 11, wherein said charge storage circuit:

receives and stores charge corresponding to said node voltage sample during a sample time period; and maintains said hold voltage during a hold time period which is nonconcurrent with said sample time period.

13. The apparatus of claim 11, wherein said charge storage circuit receives and stores charge corresponding to said node voltage sample and maintains said hold voltage concurrently.

14. The apparatus of claim 11, wherein said buffer circuit comprises a voltage follower circuit.

15. The apparatus of claim 11, wherein:

said buffer circuit comprises first and second voltage follower circuits which are mutually coupled; and said charge storage circuit is coupled between said first and second voltage follower circuits.

16. The apparatus of claim 11, wherein said charge storage circuit comprises a capacitor.

17. The apparatus of claim 11, wherein said switching circuit comprises a plurality of pass transistors.

18. An apparatus including a low leakage charge pump circuit, comprising:

node means for alternately conveying a source current, a sink current, a node voltage and a hold voltage;

current source means, coupled to said node means, for receiving at least one source control signal and providing said source current during a source time period;

current sink means, coupled to said node means, for receiving at least one sink control signal and receiving said sink current during a sink time period which is nonconcurrent with said source time period;

buffer means for receiving and buffering a sample voltage and providing said hold voltage which is substantially equal to said node voltage sample;

charge storage means, coupled to said buffer means, for receiving and storing charge corresponding to said node voltage sample and maintaining said hold voltage; and switching means, coupled between said node means and said buffer means, for receiving at least one switch control signal and alternately sampling said node voltage, providing said node voltage sample and conveying said hold voltage.

19. The apparatus of claim 18, wherein said charge storage means is for:

receiving and storing charge corresponding to said node voltage sample during a sample time period; and maintaining said hold voltage during a hold time period which is nonconcurrent with said sample time period.

20. The apparatus of claim 18, wherein said charge storage means is for receiving and storing charge corresponding to said node voltage sample and maintaining said hold voltage concurrently.

* * * * *